United States Patent [19]

Hassner et al.

[11] Patent Number: 5,487,077
[45] Date of Patent: Jan. 23, 1996

[54] LOCATION DEPENDENT VARIABLE ERROR CORRECTION PROCESSING FOR MULTI-TRACK RECORDING MEDIA USING VARIABLE LENGTH CODING MEANS

[75] Inventors: Martin A. Hassner, Palo Alto; Luke C. K. Lang, Cupertino; Norman K. Ouchi, San Jose, all of Calif.; Uwe Schwiegelshohn, Dortmund Kirchhoerde, Germany

[73] Assignee: International Business Machines Corporation, Armonk, N.Y.

[21] Appl. No.: 247,446

[22] Filed: May 23, 1994

[51] Int. Cl.⁶ .................................................. G06F 11/10
[52] U.S. Cl. .............................. 371/40.1; 371/41; 371/43
[58] Field of Search .............................. 371/40.1, 41, 43, 371/37.6, 2.1, 2.2; 360/48

[56] References Cited

U.S. PATENT DOCUMENTS

| | | | |
|---|---|---|---|
| 3,400,371 | 9/1968 | Amdahl et al. | 340/172.5 |
| 4,207,609 | 6/1980 | Luiz et al. | 364/200 |
| 5,068,858 | 11/1991 | Blaum et al. | 371/41 |
| 5,289,478 | 2/1994 | Barlow et al. | 371/40.1 |
| 5,375,127 | 12/1994 | Leak et al. | 371/40.1 |
| 5,379,305 | 1/1995 | Wing | 371/41 |

*Primary Examiner*—Paul P. Gordon
*Attorney, Agent, or Firm*—Baker, Maxham, Jester & Meador

[57] ABSTRACT

The error correction code capability of the linear recording density of a zone of contiguous recording tracks on a surface or volume having at lest two zones of different average linear recording density is adjusted. Each zone has associated therewith a parameter pair (r,R) defining the number of error correction bytes r to be appended to data blocks to form a codeword written to tracks within the zone and the number $R \leq (r/2-1)$ of correctable errors in the event of a non-zero remainder detected upon readback of a codeword from a track within the zone. The r parameter controls the length of a shift register type encoder syndrome generator.

7 Claims, 4 Drawing Sheets

CONTROL UNIT INCLUDING SYNCHRONOUS ACCESSING MEANS AND
PROGRAMMABLE ENCODER/SYNDROME GEN. AND DECODER

DASD WITH ZONES OF DIFFERENT
LINEAR TRACK RECORDING DENSITY

| ZONE 4 | BYTE 1....     BYTE 2...     BYTE N<br>ECC1        ECC2 |
|---|---|
| ZONE 3 | BYTE1 .. BYTE2 .. BYTE3    ECC1    ECC2    ECC3 |
| ZONE 2 | BYTE1 BYTE2 BYTE3 BYTE4......BYTEN ECC1 ECC2 ECC3 ECC4 |
| ZONE 1 | B1 B2 B3 B4 ..BI BJ ..BN ECC1 ECC2 ECC3 ECC4 ECC5 B'1 B'2..B'N ECC1 ECC2 ECC3 ECC4 ECC5 |

ECC BYTES PER RECORDED DATA BLOCK
VARIES AS RECORDING DENSITY VARIES

CONTROL UNIT INCLUDING SYNCHRONOUS ACCESSING MEANS AND
PROGRAMMABLE ENCODER/SYNDROME GEN. AND DECODER

DECODER RESPONSIVE TO AN ACCESSED CODEWORD FROM A DISK TRACK AND THE SYNDROME GENERATOR

LOCATION DEPENDENT VARIABLE ERROR CORRECTION PROCESSING FOR MULTI-TRACK RECORDING MEDIA USING VARIABLE LENGTH CODING MEANS

FIELD OF THE INVENTION

This invention relates to a method and means for increasing the amount of storage available for recording data blocks on magnetic or optical disk tracks, and more particularly, for effectuating seamless processing of check symbols appending said data blocks from disk tracks where the number of check symbols appending any data block is a location dependent variable.

DESCRIPTION OF RELATED ART

It is known that strings of data symbols written to and read from cyclic, multi-tracked magnetic, optical or equivalent storage media are subject to random or systematic error or erasure. It is further known to mix a sequence of data symbols with checking symbols from a suitably designed error correcting code to form a codeword of multiple symbols in length and to write the codeword on a recording track extent (a sector or fraction thereof). Conceptually, this is similar to dividing a block of data symbols of some fixed number by an algebraic structure that possesses properties of the error correction code and appending any remainder of the division operation to the data block. The resulting code word includes data symbols+redundant symbols. In the case of linear block codes, the structure is in the form of a generating code matrix. In the case of linear cyclic codes, the structure is in the form of a rational polynomial defined over a finite field.

The recorded codeword is read back from the storage medium on an opportunistic or scheduled basis. As part of this readback process, the codeword is tested on the fly by dividing it by the algebraic structure. If the remainder of the division operation is zero, the codeword is deemed to be without error. The checking symbols may be removed so that the data block may be utilized by any application executing on a CPU accessing the data. However, a non-zero remainder is indicative of error or erasure and additional correction processing is required. Where the number of symbols in error or erasure are within the correction capacity of the code, then correction can be immediately performed usually by hardware means.

Where the errors or erasure exceed the correction capability of the code, then failure is reported to the storage subsystem control unit. The control unit can ignore the error, repeat the correction attempt, and/or treat the failure as an indication that the storage device is in a degraded or failed mode.

Linear Block Codes

A linear block code C is formed from a set of codewords of length n defined over an alphabet and having the property of closure under addition and multiplication of any pair of the codewords. The capacity of the code to detect and correct errors is related to the minimum distance among the codewords. The distance is the number of symbol differences between any pair of words. As a general proposition, in order to correct $t<n$ errors, the codewords must be separated by a distance of at least $2t+1$ symbols from each other.

As mentioned above, a linear block code C uses a generating matrix $G(x)$. The rows of $G(x)$ are formed from a codeword subset of C, which subset must meet certain strict conditions such as linear independence and spanning C. As used in encoding, a linear block codeword U is the matrix product $m*G$ of a 1Xk vector of say binary data symbols $m_i$ with the kXn generating matrix $G(x)$. Thus, $U = m_0 * v_0 + m_1 * V_1 + \ldots + m_k v_k$ such that if $$m = m_0\, m_1\, m_2 = 1\ 1\ 0 \text{ and } G = \begin{matrix} v_0 \\ v_1 \\ v_2 \end{matrix} = \begin{matrix} 1\ 1\ 0\ 1\ 0\ 0 \\ 0\ 1\ 1\ 0\ 1\ 0 \\ 1\ 0\ 1\ 0\ 0\ 1 \end{matrix}$$

then $$U = [1\ 1\ 0]\ \begin{matrix} v_0 \\ v_1 \\ v_2 \end{matrix} = 1*v_0 + 1*v_1 + 0*v_2 = 110100 + 011010 + 000000$$

$$\underline{U = 101110}$$

Linear Cyclic Codes

A linear code C is said to be a linear cyclic code if the cycle shift of each codeword is also a codeword. If each codeword u in C is of length n, then the cyclic shift $\pi(u)$ of u is the word of length n obtained from u by shifting the last digit of u and moving it to the beginning, all other digits moving 1 position to the right.

| u | 10110 | 111000 | 0000 | 1101 |
|---|---|---|---|---|
| $\pi(u)$ | 01011 | 011100 | 0000 | 1101 |

Significantly, an algebraic structure (generating polynomial $g(x)$) multiplies a block of binary data symbols, the block to produce a codeword. and the codewords themselves may each be represented by a ordered tuple of coefficients (i.e. 101) or as a rational polynomial expansion of an arbitrary place variable (i.e. $1*x^0+0*x^1+1*x^2$). Conventionally, coding polynomials are depicted in low to high order. The polynomial $f(x)=a_0+a_1 x+a_2 x^2+ \ldots +a_{n-1} x^{n-1}$ of degree at most of n-1 over K may be regarded as the word $v=a_0 a_1 a_2 \ldots a_{n-1}$ of length n in $K^n$. For n=7:

| polynomial | tuple/word |
|---|---|
| $1 + x + x^2 + x^4$ | 1110100 |
| $1 + x^4 + x^5 + x^6$ | 1000111 |
| $1 + x + x^3$ | 1101000 |

A cyclic code uses a generator polynomial in the same way as a linear block code uses a generator matrix.

Let $g(x)$ be the generator polynomial for an (n,k) cyclic code over $K=\{0,1\}$. Thus, $g(x)=g_0+g_1 x+g_2 x^2+ \ldots +g_r x^r$.

Every codeword polynomial in the linear cyclic code C is of the form $U(x)=m(x)g(x)$ where $U(x)$ is a polynomial of degree (n-1) or less. The block of binary data re(x) may be expressed as a polynomial $$m(x)=m_0+m_1 x+m_2 x^2+ \ldots +m_{n-r-1} x^{n-r-1}$$

Since every codeword polynomial $U(x)$ in an (n,k) cyclic code can be expressed as a product $U(x)=m(x)*g(x)$, then this may be expanded as $$U(x)=m(x)*g(x)=(m_0+m_1 x+m_2 x^2+ \ldots + m_{n-r-1}\ x^{n-r-1})*g(x)$$

Significantly, $U(x)$ is a valid codeword upon readback, if and only if $g(x)$ divides into $U(x)$ WITH A REMAINDER=0.

Systematic Form

Codes and codewords are processed in a standardized format termed systematic format. In the case of a linear block code, any valid kXn generator matrix $G(x)$ must have its first k columns in the form a kXk identity sub-matrix. Thus, matrix multiplication of a block of n data symbols by $G(x)$ produces an n symbol codeword consisting of k data symbols and $(n-k)$ error correction symbols. The $(n-k)$ digits may also be denominated as redundancy, parity check or ECC symbols. Each codeword $U(x)$ in a linear cyclic code is of the form $U(x)=r_0,r_1,\ldots,r_{n-k-1},m_0,m_1,\ldots,m_{k-1}$. This too includes k data symbols and n–k redundancy symbols. Cyclic Codewords Expressed Systematically Using Multiplication and Division (Shifting And Quotient/Remainder Operations)

Suppose that the generator polynomial $g(x)=1+x+x^3$ and that the block of data $m=1011=1+x^2+x^3$, then $k=4$, $n-k=3$, and $n=7$. Note that m has a length 4 and g has a length 3 and the codeword length n is their sum. The transformation is as follows:

(1) Multiply $m(x)$ by the term $x^{n-k}$: $x^{n-k}*m(x)=x^3(1+x^2+x^3)=x^3+x^5+x^6$ (2) Dividing $x^{n-k}*m(x)$ by $g(x)$ where $q(x)$ is a quotient and $r(x)$ is a remainder $$x^{n-k}*m(x)/g(x)=q(x)+r(x) \text{ or } x^{n-k}*m(x)=q(x)*g(x)+r(x)$$

(3) Expressing $r(x)$ in modulo form: $r(x)=x^{n-k}*m(x)$ modulo $g(x)$ (4) Combining (1) and (3) $r(x)+x^{n-k}*m(x)=U(x)$
Substituting in (2) $x^{n-k}*m(x)=q(x)*g(x)+r(x)$ and $$x^3+x^5+x^6=(1++x+x^2+x^3)(1+x+x^3)+1$$

Therefore $r(x)=1+0*x+0*x^2$ and $U(x)=r(x)+x^{n-k}*m(x)=1001011$

Usage Of Reed Solomon Codes

Reed Solomon (RS) codes are among the most extensively used error correcting codes since they maintain the maximum distance among codewords for a given length n. An RS code, although a linear cyclic code, is also deemed a block code. The latter derives from the fact that it uses a generating polynomial over a finite (Galois) field having a multiple symbol alphabet of codewords whose recording length is that of a sector or a portion of a track sector.

Error Correction Varied As A Function Of The Track Location On a Recording or Storage Disk Blaum et. al., U.S. Pat. No. 5,068,858, "Error Correction Capability Varied With Track Location On A Magnetic Or Optical Disk", issued Nov. 26, 1991 disclosed a method and means for error correction encoding and decoding of sequences (blocks) of data symbols (bytes) using a linear cyclic code such that the number of check symbols (bytes) appending each data block could be reduced as a function of the band or zone of contiguous concentric tracks.

The result in Blaum was based on the observation that for conventional recording the linear recording track density varies as an inverse function of the radius moving from the disk center to circumference. As a consequence, the errors tend to be clustered in the dense inner zones of tracks. This implied that the number of error correction bytes appending each block could be progressively reduced where the blocks were recorded on the less dense outer zones. An alternative to reducing the number of ECC bytes per block is to reduce the codeword size.

Upon writing to the magnetic or optical tracked recording medium, Blaum appends each data block with the maximum number of check symbols t permitted under the constraints of the linear cyclic code. However, his method inexorably discards a predetermined number of the check symbols as a function of the disk zone onto which the data block will be recorded.

Now, Blaum uses an encoder and decoder for processing a linear cyclic code of the Reed Solomon (RS) type. His RS encoder is constrained as $[k+2(t+m-1),k]$ and produces redundant bytes $b_0,b_1,\ldots,b_{2(t+m-1)-1}$ responsive to a string of data bytes $a_0,a_1,\ldots,a_{k-1}$. The redundant bytes are sent to a deleter along with the recording track number i.

The deleter guided by the track information discards the first $2(m-i)$ error correcting symbols (redundant bytes) so that the string actually recorded on the i-th track is of the form:

$$b_{2(m-i)}, b_{2(m-i)+1}, \ldots, b_{2(t+m-1)-1}, a_0, a_1, \ldots a_{k-1}.$$

It is also the case that Blaum's syndrome generator generates all of the syndromes all of the time. This necessitates advising the decoder that some of the syndromes must be treated as erasures. To avoid this, an erasure generator polynomial must be formed and the syndromes normalized by the erasure polynomial in order to remove their effect. This unnecessarily complicates the processing and extends the time over which the processing occurs. Restated, Blaum's method and means by requiring computation of an erasure generator polynomial and renormalization of all concurrent syndromes by this polynomial increases the latency attending an on the fly encoding (writing to storage) and decoding (reading from storage) process.

SUMMARY OF THE INVENTION

It is accordingly an object of this invention to devise an error correction coding method and means for varying the number of check symbols appending a block of data symbols as a function of location on a cyclic multi-tracked recording medium.

It is a related object that such method and means seamlessly generate the number of check symbols proportional to the error correction capability assigned to the location on the recording medium ab initio for each block of data symbols to be written on the medium.

It is yet another object that the encoding and decoding of said error correction symbols appending counterpart blocks of data symbols be controlled in a synchronous manner in the presence of any combination of sequential or random read and write operations.

It is still another object that the method and means should provide that in the event that burst error exceeds some predetermined lower bound that the decoder can be programmed to correct the longer error burst without having to resort to correction external to the error correction means.

A method and means in satisfaction of the above objects for adjusting the error correction code capability to the linear recording density of a zone of contiguous recording tracks on a surface or volume has at least two zones of different average recording density in a moving magnetic storage subsystem. In this invention, each zone has associated therewith a parameter pair $(r,R)$. This pair defines the number of error correction bytes r to be appended to data blocks to form a codeword written to tracks within the zone and the number R of correctable errors in the event of a non-zero remainder detected upon readback of a codeword from a track within the zone. The r parameter controls the length of a shift register type encoder syndrome generator.

More particularly, upon writing a block of k data symbols to a track in a first one of the zones, the length of a shift register encoder is adjusted by the r parameter. Next, r ECC symbols are generated by convolving the data block through said adjusted encoder and recording a k+r codeword in the track in said first zone. At any time subsequent to writing the k+r codeword to the medium the codeword is read back by adjusting the length shift register encoder operating as a syndrome generator by the parameter r associated with the first zone, convolving it through the encoder to ascertain the presence of a non-zero remainder. In the event of a non-zero remainder, the decoder recomputes the codeword under control of the syndromes to resolve up to R symbols in error. If the errors are not correctable such as the errors exceeding the correction capacity $R \leq (r/2-1)$ symbols in error of the code, then signal indication of this fact is sent to the control unit.

DESCRIPTION OF THE PREFERRED EMBODIMENT

The System Environment This invention can be conveniently practiced in a configuration in which each CPU in the system is an IBM/360 or 370 architected CPU having an IBM MVS operating system. An IBM/360 architected CPU is fully described in Amdahl et al, U.S. Pat. No. 3,400,371, "Data Processing System", issued on Sep. 3, 1968. A configuration involving CPU's sharing access to external storage is set forth in Luiz et al, U.S. Pat. No. 4,207,609, "Path Independent Device Reservation and Reconnection in a Multi-CPU and Shared Device Access System", filed May 8, 1978, issued Jun. 10, 1980.

An MVS operating system is also set out in IBM publication GC28-1150, "MVS/Extended architecture System Programming Library: System Macros and Facilities", Volume 1. Details of standard MVS or other operating system services such as local lock management, sub-system invocation by interrupt or monitor, and the posting and waiting of tasks is omitted. These OS services are believed well appreciated by those skilled in the art.

The Storage Subsystem Environment

Figures 1, 2:
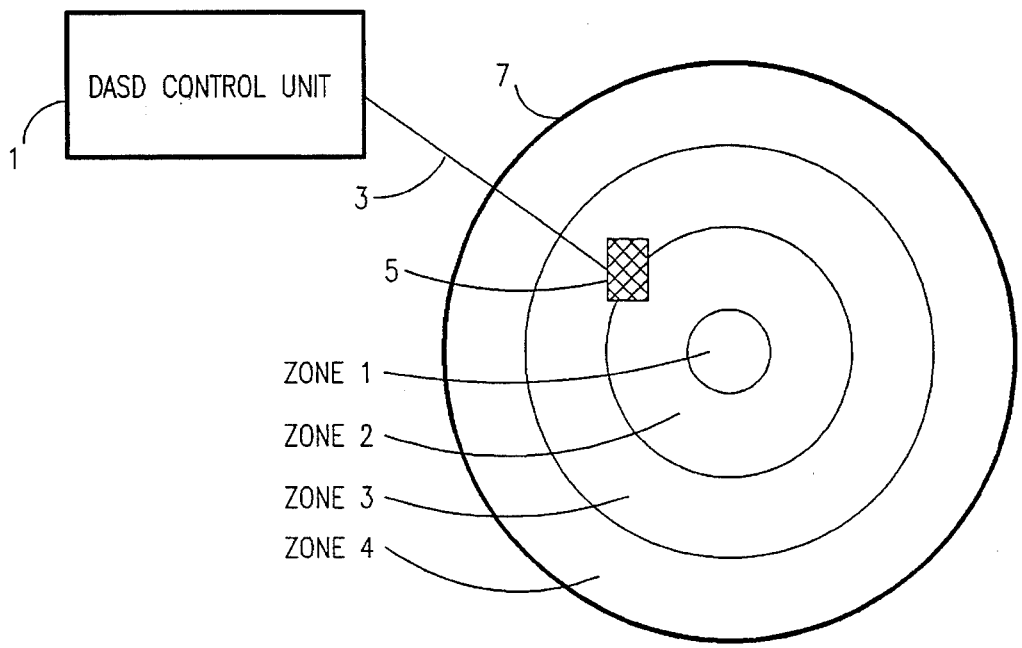
FIG 1. depicts a cyclic multitracked magnetic or optical disk with zones of different linear track recording density.
FIG. 2 shows variation in the number of error correction (ECC) bytes per data block as the recording density varies.

Referring now to FIG. 1, there is shown a direct access storage device (DASD) control unit 1 coupling a cyclically rotatable disk 7. The disk is partitioned into a predetermined number of zones. Each zone comprises a fixed number of contiguous recording tracks. The tracks within the innermost zone I record the same number of bytes on the same number of sectors as the tracks within the outermost zone 4. Since the circumferential distance along the tracks in any zone are length ordered as zone 4>zone 3>zone 2>zone 1, it follows that the linear recording density in bytes per inch is lower in the outer zones than in the inner zones. Indeed, the above mentioned Blaum patent points out that track recording density varies inversely with radial distance from the disk center. This is depicted by the variation in shading from dark to light on disk 7.

A radially positionable arm 3 actuable by the control unit moves a read/write transducer 5 to different tracks within different zones on the disk responsive to a series of channel commands such as SEEK, SET SECTOR, READ and WRITE commands. As described in the Amdahl and Luiz patents, an application executing on a CPU accesses data not available in main memory by invoking a virtual machine known as a "channel".

The channel sends a series of access commands to an attached DASD storage subsystem to either fetch data to read and process, update a previously stored data block or write a new data block to DASD. The SEEK and SET SECTOR commands cause the control unit 1 to position the transducer 5 over the track of and to read or write the entire track or sector or portion thereof in a streamed mode. This necessarily includes appending appropriately calculated error correction code symbols to blocks of data symbols to form codewords and to write the codewords on a designated disk track.

When a codeword is read from a track it is tested for error. If free from error, the error correction symbols may be deleted and the data block passed upward in the attached storage hierarchy such as storage cache or CPU internal memory. If error is detected, it may either be ignored, re-read, or corrected at the election of the storage architecture or CPU executing application.

Referring now to FIG. 2, there is shown the variation in the number of error correction symbols per data block as the recording density varies. Typically, data and error correction symbols are byte organized. This means that an n byte linear block or cyclic codeword is represented by a data block of k data bytes and (n–k) ECC bytes either prefixing or suffixing (appending) the data bytes. In this figure, the data blocks written on the tracks in the outermost zone 4 are appended by 3 ECC bytes/block while those written on the tracks in the innermost zone 1 are appended by 5 ECC bytes per block. The actual number of ECC bytes are governed by the constraints of the correction actually used.

Error Correction Capability As Managed In The Preferred Embodiment

Figure 3:
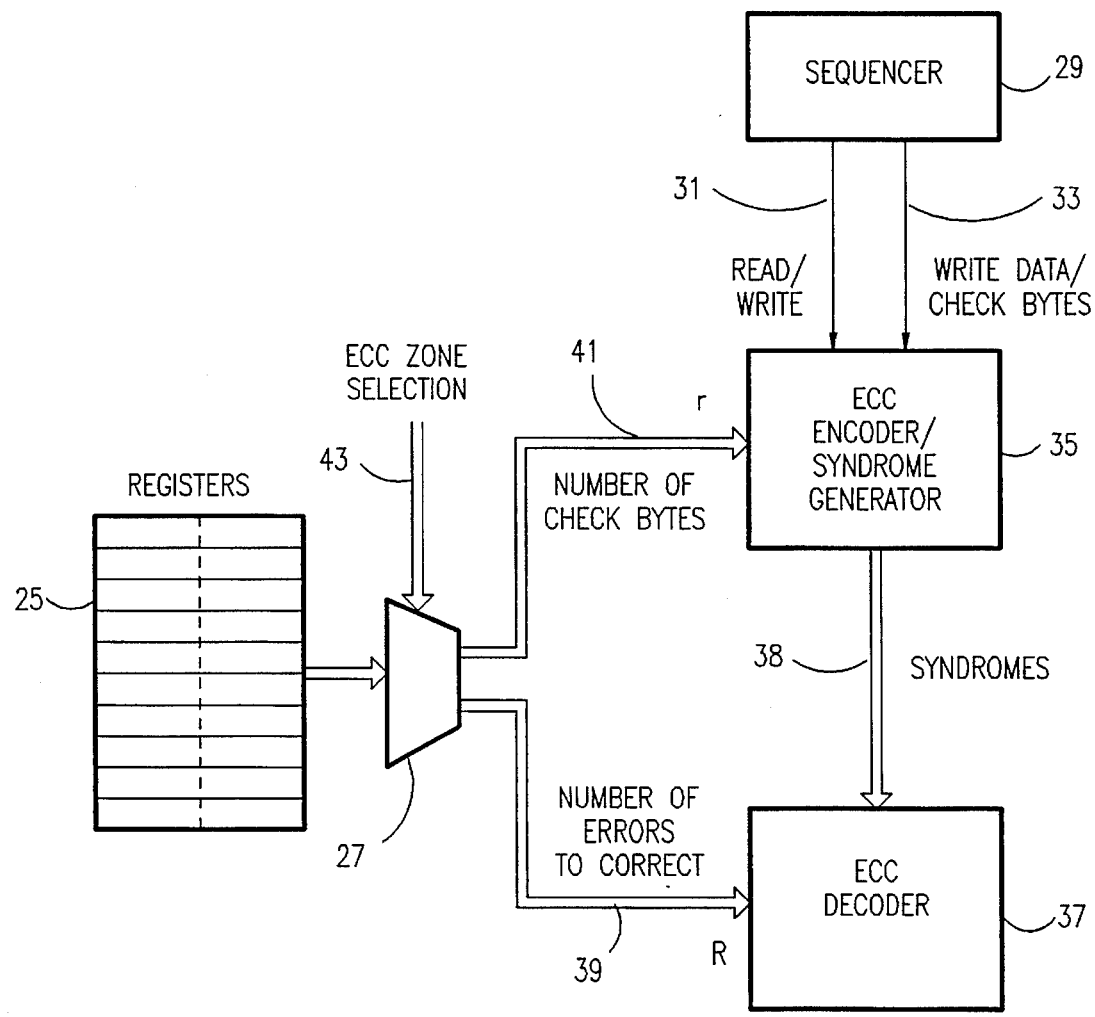
FIG. 3 sets out the logical organization of an ECC encoder and decoder synchronized to provide seamless generation of check symbols appending data blocks where the ECC varies as a function of track/zone location.

Referring now to FIG. 3, there is shown the logical organization of an ECC encoder/syndrome generator 35 and decoder 37 synchronized to provide seamless generation of check symbols appending data blocks where the number of ECC varies as a function of track/zone location. The logic in FIG. 3 is ordinarily sited in control unit 1 shown in FIG. 1. The logic includes a sequencer 29 coupling the encoder/syndrome generator 35. The sequencer is responsive to externally supplied instructions for configuring and controlling the ECC code/decode functions. These include specification of the number "r" of ECC bytes and the number of correctable symbols assigned for use in the different zones. The number of ECC bytes and the number of correctable symbols are stored in counterpart ones of register set 25 corresponding to different zones. The number of ECC symbols controls encoder 35 by setting the number of connected taps and whence varying the length of the shift register encoder/syndrome embodiment depicted in FIG. 4.

When a data block is to be written to a DASD disk address, the track number and zone are used to access register set 25. The parameters are applied through selector 27 over path 41 to encoder 35. When a data block is to be read from a DASD disk address, the register set is again accessed and parameters are applied to the encoder 35 and decoder 37 over paths 41 and 39 respectively. These are the number of check bytes "r" and the maximum number of correctable errors "t".

When reading a data block, it is necessary to compute the "syndromes". Conceptually, this means dividing the stored codeword (data block+ECC bytes) by g(x) to determine whether it has a non-zero remainder. This is performed by the encoder operating as a syndrome generator. In the case of "division", the length of the polynomial "divisor" must be same as that used in encoding. Also, where the remainder is non-zero, the decoder 37 is responsive to the syndromes from generator 35 over path 38 for recomputing the codeword and correcting the errors identified by the syndromes.

It should be appreciated that in the preferred embodiment of this invention, Reed Solomon (RS) codes are the error correction codes of choice. RS codes are linear cyclic codes which may be treated as linear block codes if they are used over standard blocks such as 512 bytes as recorded within each track sector on a magnetic disk medium or the like. Advantageously, RS codes in this context can correct bursts or runs of errors in addition to independently occurring errors. The detection and correction of error runs is not a noted attribute of linear block codes.

Stated another way, RS codes are expressed in symbols in a finite field. A finite field comprises a set of numbers closed under the binary operations governing finite arithmetic. This means that any pair of elements in the field subject to the binary operations of addition, subtraction, multiplication, or division will yield a resultant element within the field. An archetype of a field are binary operations over a set of fractions. While the field of fractions is infinite, the RS codewords form a FINITE field formed from a subset of integers whose size is defined by a prime number raised to a power.

RS codes are standard error correcting codes accepted in industry because they come closest to maintaining $2t+1$ distance between codewords of any length n thereby enabling detection and correction of $\leq t$ errors. RS operates at the symbol or byte level. The number of bits/symbol could be arbitrary such as 1,7,33 etc. However, the industry prefers symbols where the number of bits per symbol is expressed as powers of 2 such as $2^8$ or $2^{10}$. In this instance, "two" is the prime number raised to the power ten. Since 512 bytes are recorded in the average DASD track sector, then $2^{10}$ is a number which spans the sector recording and also defines the domain from which codewords are selected.

In order to facilitate arithmetic operations over a finite field the codeword or symbols are expressed as elements of a Galois Field (GF). Thus, if an integer within a finite field is expressed as a rational polynomial of irreducible roots, then binary operations over the roots of polynomials are closed.

Figure 4:
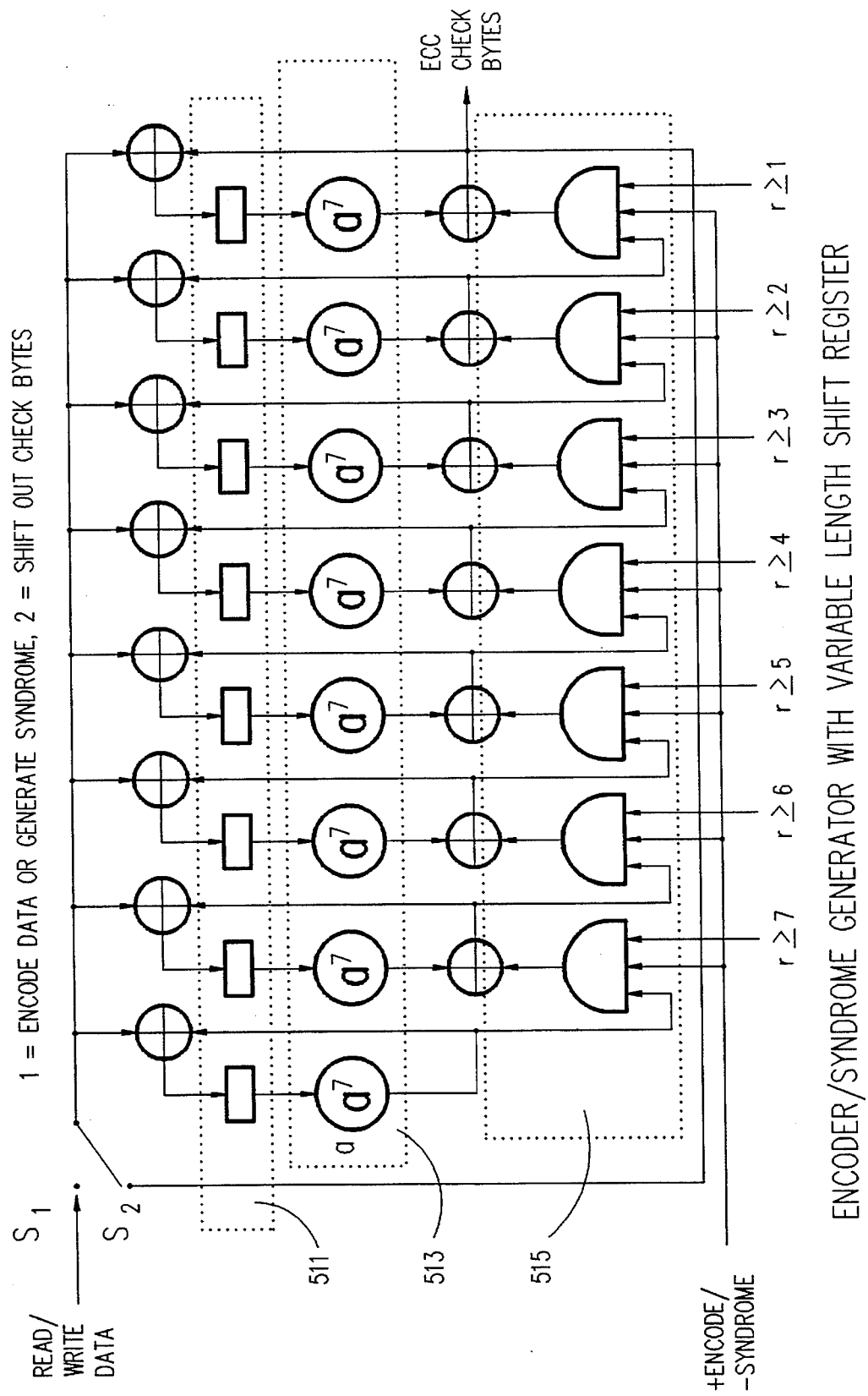
FIG. 4 illustrates a syndrome generator/encoder having a variable length shift register according to the invention.

Referring now to FIG. 4, there is shown a modified version of an adjustable error correction composite Reed Solomon encoder/syndrome generator described in the copending Cox et. al. U.S. Ser. No. 08/008,922, filed Jan. 26, 1993 (IBM Ref. No. SA 9-92-102). A Cox type encoder/syndrome generator includes a plurality of multiplier devices that have tap weights with preselected values for computing the check symbols (ECC bytes). This plurality of multiplier devices also computes error syndromes. The syndromes determine error locations and values in any codeword being read back from the storage disk tracks. The generator further includes a gating arrangement for adjusting the number of active multiplier devices from the set of devices participating in the coding to provide a desired number of ECC bytes.

Referring again to FIG. 3, as used in this invention the Cox encoder provides that the data block be serially applied to encoder 35 over path 33 when the switch is set to position S1 for either encoding or syndrome determination. The data bytes are convolved with a generating polynomial g(x) selected from a suitable Reed Solomon code through respective encoder register logic stages. The polynomial and more particularly the irreducible roots of g(x) are provided by register values $a^7, a^6, \ldots, a^0$ associated with counterpart stages. Significantly, the length of g(x) and whence the number of ECC bytes is controlled by a parameter "r". Parameter "r" is one of the two numbers stored in register set 25 for each zone. Parameter "r" is applied as a length control signal to encoder 35 over a selectable one of the AND gate set paths denominated $r \geq 7, r \geq 6, \ldots, r \geq 1$. When one of the paths say "$r \geq 5$" is activated, then the outputs from the higher level polynomial multiplication stages $a^7$ and $a^6$ are inhibited. The feedback encoder (syndrome) output is taken from the last active tap. Note that the ECC bytes are shifted out when the switch is in position S2.

Figure 5:
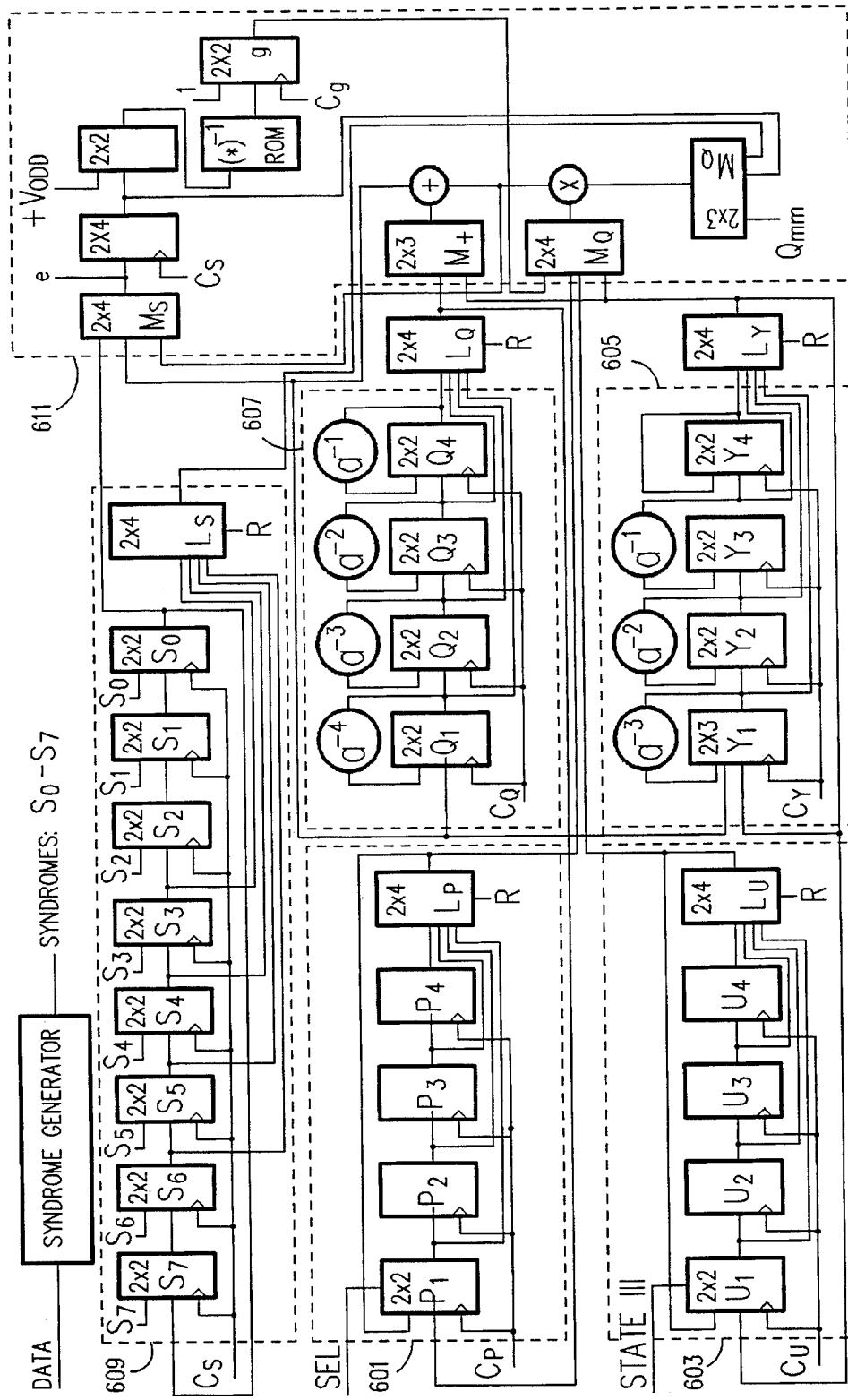
FIG. 5 sets forth a decoder responsive to the codeword and syndrome generator of FIG. 4.

Referring now to FIG. 5, there is shown a modified decoder 37 of the type disclosed in the copending Fettweiss et. al., U.S. Ser. No. 07/917,704, filed Jul. 20, 1992 (IBM Ref. No. SA9-92-019). The decoder comprises a plurality of variable length shift registers and a plurality of multiplexors. The decoder further includes a sequencer for generating signals controlling the shift registers and the multiplexors from the corrupted codeword symbols and a processor for iteratively correcting the bytes in error identified by the syndromes over a period of time proportional to $3t^2+kt$ where k lies in the range $2 \leq k \leq t$ and t is the number of correctable symbols in error.

The shift registers 601, 603, 605, 607 and 609 store the final as well as the intermediate coefficient values of both the error locator and error evaluator polynomials. The sequencer is a combination of Finite State Machines which execute an iterative algorithm whose inputs are discrepancy values obtained from computing determinants of increasing order of circular syndrome matrices.

The outputs of the iterative algorithm are the states of the Finite State machines which control both the registers as well as the multiplexors through which the relevant register contents are passed to an arithmetic unit 612 for computational update.

Note that each of the registers has logic providing for input of parameter $R \leq (r/2-1)$ defining the length of burst in error to which the check symbols and the remainder in error should be applied for correction purposes.

Typical Operations Using The Invention

In the following discussion it is assumed that there is no interleaving of data, a maximum of eight ECC check bytes, and a DASD disk partitioned into three recording zones. Also, codeword=data block+ECC bytes/zone. The three zones are laid out in the manner of FIG. 2 such that zone I having the highest byte recording density will have recorded thereon a k byte data block with n−k=8 ECC check bytes. In the event that an error is detected the ECC decoder 37 will attempt correction for R bytes of one error. Whence R on path 39 to the decoder is set equal to 1, 2, or 3. These may be tabulated as follows:

| DISK ZONE | RECORDING DENSITY | NO. OF ECC BYTES APPENDED/BLOCK | MAX. CORRECTABLE BYTES/BLOCK |
|---|---|---|---|
| 1 (INNER) | HIGHEST | 8 | 3 |
| 2 (MIDDLE) | INTERMEDIATE | 6 | 2 |
| 3 (OUTER) | LOWEST | 4 | 1 |

Suppose the CPU via the channel sends a write command to store accompanying data block in sector 1000. The DASD control unit 1 (CU) ascertains from a local disk map stored in the control unit that sector 1000 is located on a track within zone 1. The control unit then accesses register set 35 in FIG. 3 via zone selector control 27 to obtain the parameters associated with zone 1. Thus, the length of encoder 35 is set to correspond to r=8 and the encoder input switch set to S1. The data block is then applied to the encoder over a path including sequencer 29 and line 33. At the point in time when the eight ECC bytes are calculated, they are outputted (via the last active tap on encoder 35 and the switch being set in position S2) along with the data to a write buffer (not shown) in a path to sector 1000 in zone 1 on the disk.

Suppose, it is desired to read a data block stored on disk sector 3000. The CU determines from the disk map that sector 3000 is located in zone 2. The CU then accesses register set 35 and obtains the parameters associated with zone 2. This includes setting the encoder 35 acting as a syndrome generator to r=6. The ECC decoder is set to R=2. The data block from sector 3000 is passed through the encoder/syndrome generator 35 with the switch set to position S1. After the data block is processed in the encoder, the six syndrome bytes are stored in latches 511 in the generator 35. If the syndromes are zero, then the data has been read without error and can be passed upward in the storage hierarchy. If the syndromes are not zero, the decoder will attempt correction of up to two bytes in error in the manner described above. Failing correction, decoder 37 provides signal indication of that fact to the CU.

Extensions

When an error is detected by calculating a non-zero remainder upon reading the codeword from a track sector, the number of symbols in error is not known a'priori. Also, it is standard practice to assume that the symbols in error are usually limited to one byte bursts. If attempted error correction fails, because a burst may be longer than one byte, current practice includes reading the codeword into a buffer at the subsystem or system level and attempting software driven correction for a longer error burst. This loads the processor and reduces throughput. Such result may be ameliorated by reprogramming each of the R values associated with each of the zones in the register set 25 such that R is set to 2 instead of 1. Thus the decoder 37 is instructed to correct over a two byte burst instead of a 1 byte burst. This subject to the limitation that the number of correctable bytes cannot not exceed half the number of ECC symbols appending each block recorded for any given zone. Apart from this limitation, the R values in the register set may be advantageously changed independently of when the codeword was formed and written to any given zone.

Another extension to the method and means of this invention is that it can be applied to other than cyclic multi track storage media. The method and means could be used in any area or volumetric storage formatted into regions or zones of approximately the same linear density within each zone. Also, the zones need not form a decreasing or increasing gradient of density among themselves since the gravamen of the invention is the use of a number of ECC bytes r and the correctable bytes R correlated with any given zone for adjusting the encoder/syndrome generator and the decoder, respectively, for linear error correction codes expressed over finite fields. One type of volumetric zone recording may be found in holographic or optical storage where the medium is stationary and the accessing means move relatively.

These and other extensions of the invention may be made without departing from the spirit appended claims.

We claim:

1. A method for adjusting an error correction code capability according to a linear recording density of a zone of contiguous recording tracks on a storage surface or volume having at least two zones of different average linear recording density in a moving magnetic storage subsystem, comprising the steps of:

(a) associating with each zone a parameter pair (r,R), said pair defining the number r of error correction symbols (ECC) to be appended to data blocks to form a codeword written to tracks within the zone and the number R of correctable errors in the event of a non-zero remainder detected upon readback of a codeword from a track within the zone;

(b) writing a block of k data symbols to a track in a first one of the zones by adjusting a length of a shift register encoder by the r parameter, generating r ECC symbols by convolving the data block through said adjusted encoder and recorder a k+r symbol codeword in the track in said first zone; and (c) at any time subsequent to step (b) reading back the codeword by adjusting the length of the shift register encoder operating as a syndrome generator by the parameter r associated with the first zone, and convolving it through the encoder to ascertain the presence of a non-zero remainder.

2. The method in accordance with claim 1, wherein the storage medium is selected from the set consisting of a cyclic multi-tracked disk in which contiguous zones define a radial gradient of increasing average linear recording density, a cyclic multi-tracked media disk in which contiguous zones exhibit a non-gradient pattern of average linear recording density, and a zone organized volumetric storage type.

3. An apparatus for implementing an error correction code in blocks of data symbols recorded on counterpart tracks of a storage medium, said medium being partitioned into zones of contiguous tracks, the tracks in each zone exhibiting similar linear recording density and at least two zones exhibiting dissimilar linear recording density averaged among the tracks forming the respective zones, comprising:

(a) means including a polynomial encoder of an adjustable length type responsive to a data block destined for a track in a given zone, for adjusting the encoder length so as to produce a predetermined number of redundant symbols associated with the given zone, calculating redundant symbols over the data block in the adjusted encoder, appending the redundant symbols to the block and writing the block and appended symbols to the track in the given zone;

(b) means for accessing the data block and appended redundant symbols from the track and given zone, adjusting the encoder length to define a polynomial divisor associated with the given zone, and ascertaining the presence of a non-zero remainder by dividing said data block and redundancy symbols by said divisor in said encoder; and (c) means responsive to the non-zero remainder for correcting any errors or erasures in the data block.

4. The apparatus according to claim 3, wherein said means for correcting any errors or erasures in the data block includes:

decoding means responsive to the accessed data block and including means for utilizing r redundant symbols appending the accessed data block and any non-zero remainder for correcting a burst of $R \leq (r/2-1)$ symbols in error in the accessed block, where $R \leq (r/2-1)$ and (r,R) is an ordered pair of parameters associated with each zone.

5. In a system for writing records onto a cyclic, multi-track storage medium, said medium being partitioned into zones or bands each formed from a predetermined number of contiguous tracks of approximately similar linear track recording density, the density among the zones varying inversely from innermost to outermost, each record having at least a data field and a redundancy code (ECC) field calculated over the data field, the system including means responsive to each record for calculating one or more redundancy coded symbols, and means for writing each record to a designated track in one of the zones, the number of redundancy symbols appending each record being a function of the approximate track recording density of said one of the zones, wherein said calculating means further comprises:

an encoder and syndrome generator of a variable length shift register type;

means responsive to each record data field and track address, for ascertaining the zone of the track address, for changing the length of the shift register encoder to a predetermined value associated with the zone, applying the data field to the encoder, and causing the encoder to calculate the number of redundancy symbols over said data field, said number varying with the register length; and means for appending the redundancy symbols so calculated to the data field and writing the record to the zone and track address associated therewith.

6. In a system according to claim 5, wherein the system further comprises means for reading a record from said medium and including means responsive to the track address and to the record, for ascertaining the zone, for changing the length of the shift register syndrome generator to a predetermined value associated with the zone, applying the record to said changed length generator, and ascertaining whether there exists a non-zero remainder; and means responsive to a non-zero remainder for ascertaining and correcting any data or redundancy fields in error.

7. In an apparatus having error correction coding means dividing a fixed length block of data symbols by a coding polynomial producing a series of check symbols, for appending said check bytes to the block of data, and for recording said block on a selected one of a plurality of zones of contiguous tracks of a cyclic multi tracked storage subsystem, at least two of the zones exhibiting dissimilar linear track recording densities, wherein the improvement comprises:

means for varying the length of the coding polynomial as a function of the zone thereby varying a number r, where r represents a number of check symbols recorded on zones exhibiting dissimilar linear track recording densities;

means for reading at least one recorded data block and the appended check symbols from a selected one of the zones, for ascertaining the coding polynomial of the length associated with the zone, and determining the presence of a non-zero remainder by dividing the read data block and appended check symbols by the ascertained coding polynomial;

means responsive to the non-zero remainder for correcting errors to erasures having a burst length of R, where $R \leq (r/2-1)$ symbols, each zone has having associated therewith (r,R); and means for storing an ordered pair (r,R) for each zone such that r for a dense zone being assigned a higher value than an r for a less dense zone and R is assigned any integer value subject to the burst length constraint.

* * * * *